(12) United States Patent
Peng et al.

(10) Patent No.: US 9,659,971 B2
(45) Date of Patent: May 23, 2017

(54) ARRAY SUBSTRATE AND LIQUID CRYSTAL DISPLAY DEVICE

(71) Applicant: BOE Technology Group Co., Ltd., Beijing (CN)

(72) Inventors: Kuanjun Peng, Beijing (CN); Yunyun Tian, Beijing (CN); Hyunsic Choi, Beijing (CN); Heecheol Kim, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 259 days.

(21) Appl. No.: 14/342,154

(22) PCT Filed: Nov. 12, 2013

(86) PCT No.: PCT/CN2013/086921
§ 371 (c)(1),
(2) Date: Feb. 28, 2014

(87) PCT Pub. No.: WO2014/201796
PCT Pub. Date: Dec. 24, 2014

(65) Prior Publication Data
US 2015/0236042 A1   Aug. 20, 2015

(30) Foreign Application Priority Data
Jun. 21, 2013  (CN) .......................... 2013 1 0251163

(51) Int. Cl.
G02F 1/1337       (2006.01)
G02F 1/1335       (2006.01)
(Continued)

(52) U.S. Cl.
CPC .......... *H01L 27/124* (2013.01); *G02F 1/1368* (2013.01); *G02F 1/13439* (2013.01); *G02F 1/133345* (2013.01); *G02F 1/136286* (2013.01)

(58) Field of Classification Search
CPC ............. H01L 27/124; G02F 1/136286; G02F 2001/134372; G02F 2001/134318; G02F 2001/134345
See application file for complete search history.

(56) References Cited

U.S. PATENT DOCUMENTS

2012/0139970 A1\* 6/2012 Kim .................. G02F 1/136286
                                                     345/690
2012/0193630 A1\* 8/2012 Ham ................. G02F 1/134309
                                                     257/59
(Continued)

FOREIGN PATENT DOCUMENTS

CN     101140747 A     3/2008
CN     101276102 A    10/2008
(Continued)

OTHER PUBLICATIONS

Office action issued by Chinese Patent Office for priority Chinese application CN 201310251163.2 dated Jun. 4, 2014.

*Primary Examiner* — Nathanael R Briggs
(74) *Attorney, Agent, or Firm* — Haug Partners LLP

(57) ABSTRACT

The present invention relates to the field of liquid crystal display technology and provides an array substrate and a liquid crystal display device which can solve the problem of low transmissivity of existing liquid crystal display devices. The array substrate of the present invention comprises a plurality of pixel units, each pixel unit is provided with a plate electrode and a slit electrode arranged above the plate electrode, an insulation layer is provided between the plate electrode and the slit electrode, and the plate electrode (Continued)

extends to the periphery region of the pixel unit, the slit electrode extends to the periphery region of the pixel unit; the slit electrode and the plate electrode are both provided in at least part of the peripheral region of the pixel unit. the present invention is applicable to liquid crystal display devices, especially the liquid crystal display devices taking a "dual gate lines" design.

10 Claims, 3 Drawing Sheets

(51) Int. Cl.
*H01L 27/12* (2006.01)
*G02F 1/1368* (2006.01)
*G02F 1/1343* (2006.01)
*G02F 1/1333* (2006.01)
*G02F 1/1362* (2006.01)

(56) References Cited

U.S. PATENT DOCUMENTS

2013/0293820 A1* 11/2013 Lee .................. G02F 1/134336
                                                              349/143
2013/0342781 A1* 12/2013 Lee ...................... G02F 1/1368
                                                              349/46

FOREIGN PATENT DOCUMENTS

| CN | 102279493 A | 12/2011 |
|----|-------------|---------|
| CN | 102849962 A | 1/2013 |
| CN | 203337964 U | 12/2013 |

* cited by examiner

ARRAY SUBSTRATE AND LIQUID CRYSTAL DISPLAY DEVICE

This application is a 371 of PCT/CN2013/086921 filed on Nov. 12, 2013, which claims priority benefits from Chinese Patent Application Number 201310251163.2 filed Jun. 21, 2013, the disclosure of which is incorporated herein by reference.

FIELD OF THE INVENTION

The present invention relates to the field of liquid crystal display technology, in particular to an array substrate and a liquid crystal display device.

BACKGROUND OF THE INVENTION

FFS (Fringe Field Switching) or ADS (Advanced Dimension Switch) mode liquid crystal display device is becoming a research hotspot in development of the liquid crystal display device for the advantages of high transmissivity, wide viewing angle, wide color gamut and so on.

As shown in FIG. 1, a plurality of pixel units 9 for display (i.e. for outputting light) are arranged on the array substrate of the FFS mode or ADS mode liquid crystal display device, each pixel unit 9 is provided with a plate electrode 2, a slit electrode 1 is provided above the plate electrode 2, and an insulation layer (not shown) is provided between the plate electrode 2 and the slit electrode 1. The regions between the pixel units 9 (i.e., the peripheral region of the pixel units 9) are used for arranging the gate lines 31, data lines 32, thin film transistors 4 and other structures. The regions between the pixel units 9 correspond to the black matrixes on the color filter substrate and are therefore not used for display (i.e. not outputting light).

The "pixel unit" herein refers to a region for display, that is, a region where the light can be transmitted during displaying (light outputting region). The interval regions between the pixel units are used for arrange other structures such as the gate lines, the data lines and thin film transistors; these regions will not output light when displaying as blocked by the black matrixes, and therefore do not belong to the "pixel units". The "slit electrode" refers to an electrode structure formed by electrode strips and the slits between the electrode strips arranged alternatively. The "plate electrode" refers to a plate electrode structure used for generating a driving electric field with the slit electrodes. Both the "slit electrode" and the "plate electrode" can be obtained by performing photolithography process on a transparent conductive material layer (such as indium tin oxide). During the photolithography process, besides the slit electrodes and the plate electrodes, some conductive material layer may be remained such that electrical connection structures (for example, electrically connecting the electrode strips of the slit electrodes or electrically connecting the electrodes in different pixel units) may be formed. These electrical connection structures are not considered as a part of the slit electrodes and the plate electrodes, although they are formed simultaneously with the slit electrodes or plate electrodes.

The plate electrode 2 may be a pixel electrode and the slit electrode 1 may be a common electrode; or, the plate electrode 2 may be the common electrode and the slit electrode 1 may be the pixel electrode. Whatever the specific type of the electrodes, as shown in FIG. 1, the plate electrode 2 is normally larger than the pixel unit 9 (i.e. the plate electrode 2 extends to the external of the pixel unit 9), while the slit electrode 1 coincides with or is slightly smaller than the pixel unit 9 (i.e., the boundary of the slit electrode 1 corresponds to or is slightly smaller than the boundary of the pixel unit 9).

The inventors found at least the following problems existing in the prior art: in the FFS mode or ADS mode liquid crystal display device, the slit electrode coincides with or is slightly smaller than the pixel unit, thus the electric field distribution at the edges of the slit electrode will be different from that in the center of the slit electrode. The electric field at the edges of the slit electrode is easily disturbed, and has poor driving capability for the liquid crystal molecules, which results in a low efficiency of the liquid crystal at the edge areas of the pixel units (corresponding to the edges of the slit electrodes), and therefore the transmissivity of the entire display device is lowered.

SUMMARY OF THE INVENTION

To solve the problem of low transmissivity of the conventional FFS mode or ADS mode liquid crystal display device, the present invention provides an array substrate with high transmissivity.

The technical solution to solve the above technical problem provides an array substrate comprising a plurality of pixel units, each pixel unit is provided with a plate electrode and a slit electrode arranged above the plate electrode, an insulation layer is provided between the plate electrode and the slit electrode, and the plate electrode extends to the periphery region of the pixel unit, wherein the slit electrode extends to the periphery region of the pixel unit; and the slit electrode and the plate electrode are both provided in at least part of the peripheral region of the pixel unit.

In the array substrate according to the present invention, the slit electrode and the plate electrode are provided in at least part of the peripheral region of the pixel unit, therefore the electric field generated at the edge regions of the pixel unit is no longer different from that in the center of the pixel unit. Thus the driving capability of the electric field at the edge region is enhanced, the efficiency of the liquid crystal is increased, the transmissivity of the pixel unit is increased, and therefore the transmissivity of the entire display device is increased.

Preferably, the array substrate further comprises a plurality of gate lines and a plurality of data lines intersecting with each other, wherein the direction along which the gate lines are arranged is set as the row direction, and the direction along which the data lines are arranged is set as the column direction; N gate lines are provided between each two adjacent rows of pixel units, every N pixel units in each row of the pixel units are connected with N gate lines in an alternative manner, N is an integer no less than 2; one data line is provided at intervals of N columns of pixel units, each data line is connected with N columns of pixel units simultaneously.

"The direction along which the gate lines are arranged is set as the row direction, and the direction along which the data lines are arranged is set as the column direction" means that the length direction of the gate lines are set as the "row" direction, and the length direction of the data lines are set as the "column" direction; that is, the "row/column direction" depends on the directions of the gate lines and the data lines rather than the position, disposing manner and the like of the array substrate. "Every N pixel units in each row of the pixel units are connected with N gate lines at both sides of the row of pixel units in an alternative manner" means that at intervals of N pixel units in a same row, when being viewed from a certain direction, each of these N pixel units is respectively connected to each of N gate lines at both sides of the row of pixel units in alternative manner, in other words, any N adjacent pixel units are connected with the N gate lines in one-to-one manner. For example, if N=2, a first pixel unit from the left of one row of pixel units is connected with a first gate line at one side of the row of pixel units, the second pixel unit is connected with a second gate line at the other side of the row of pixel units, the third pixel unit is connected with the first gate line, the fourth pixel unit is connected with the second gate line, and so on. As another example, if N=3, there are 3 gate lines between each two rows of pixel units, then a first pixel unit from the left of one row of pixel units is connected with a first gate line at a first side of the row of pixel units, the second pixel unit is connected with a second gate line at the second side of the row of pixel units, the third pixel unit is connected with a third gate line at the first side of the row of pixel units, the fourth pixel unit is also connected with the first gate line at the first side of the row of pixel units, the fifth pixel unit is connected with the second gate line at the second side of the row of pixel units, and the sixth pixel unit is connected with the third gate line at the first side of the row of pixel units, and so on. Hereinafter, the expression of "every N pixel units in each column of the pixel units are connected with N data lines at both sides of the column of pixel units in an alternative manner" has a like meaning and will not be described in detail.

Further preferably, the slit electrode and the plate electrode extend to the peripheral region of the pixel unit at one side which is not adjacent to the data lines in the row direction.

Further preferably, the plate electrode is a pixel electrode, and the slit electrode is a common electrode; the slit electrodes of N adjacent pixel units which are arranged in a same row and have no data line therebetween are formed into an integral structure.

Further preferably, said N=2; every 2 pixel units in each row of the pixel units are connected with 2 gate lines at both sides of the row of pixel units in an alternative manner; each data line is connected with two column of pixel units at both sides of the data line simultaneously.

Preferably, the array substrate further comprises a plurality of gate lines and a plurality of data lines intersecting with each other, wherein the direction along which the gate lines are arranged is set as the row direction, and the direction along which the data lines are arranged is set as the column direction; a gate line is provided at intervals of N rows of pixel units, each gate line is connected with N rows of pixel units simultaneously, N is an integer no less than 2; N data lines are provided between each two adjacent columns of pixel units, every N pixel units in each column of the pixel units are respectively connected with N data lines in an alternative manner.

Further preferably, the slit electrode and the plate electrode extend to the peripheral region of the pixel unit at one side which is not adjacent to the gate lines in the column direction.

Further preferably, the plate electrode is a pixel electrode, and the slit electrode is a common electrode; the slit electrodes of N adjacent pixel units which are arranged in a same column and have no gate line therebetween are formed into an integral structure.

Further preferably, said N=2; each gate line is connected with two rows of pixel units at both sides of the gate line simultaneously; every 2 pixel units in each column of the pixel units are connected with 2 data lines at both sides of the column of pixel units in an alternative manner.

Preferably, the plate electrode and the slit electrode are provided in the peripheral regions of the pixel unit in all directions.

The technical solution to solve the above technical problem provides a liquid crystal display device comprising above array substrate.

The liquid crystal display device according to the present invention has high transmissivity for comprising above array substrate.

The present invention is applicable to the FFS mode or ADS mode liquid crystal display devices, especially to the liquid crystal display devices utilizing a "dual gate lines" design.

Figure 1:
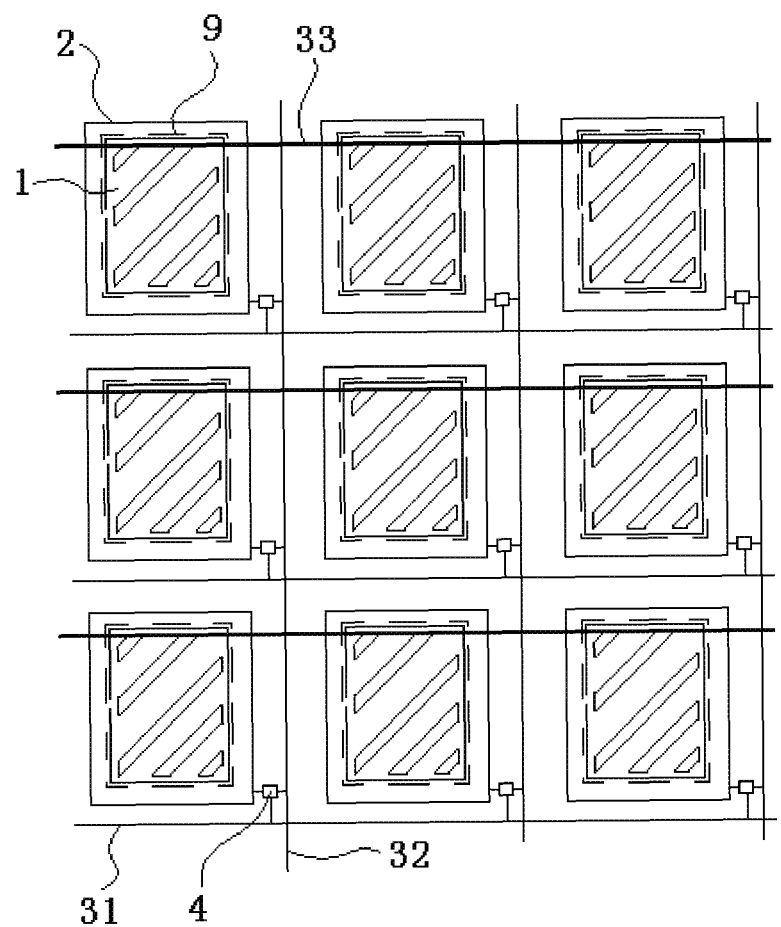
FIG. 1 is a schematic partial top view of the structure of existing FFS or ADS mode array substrate.

Reference numerals: 1, the slit electrode; 2, the plate electrode; 31, the gate line; 32, the data line; 33, the common electrode line; 4, the thin film transistor; 9, the pixel unit.

DETAILED DESCRIPTION OF THE EMBODIMENTS

The technical solutions of the embodiments of the present invention will be described in detail in conjunction with the drawings to provide better understanding of the solutions of the present invention for the persons skilled in the art.

Embodiment 1

Figure 2:
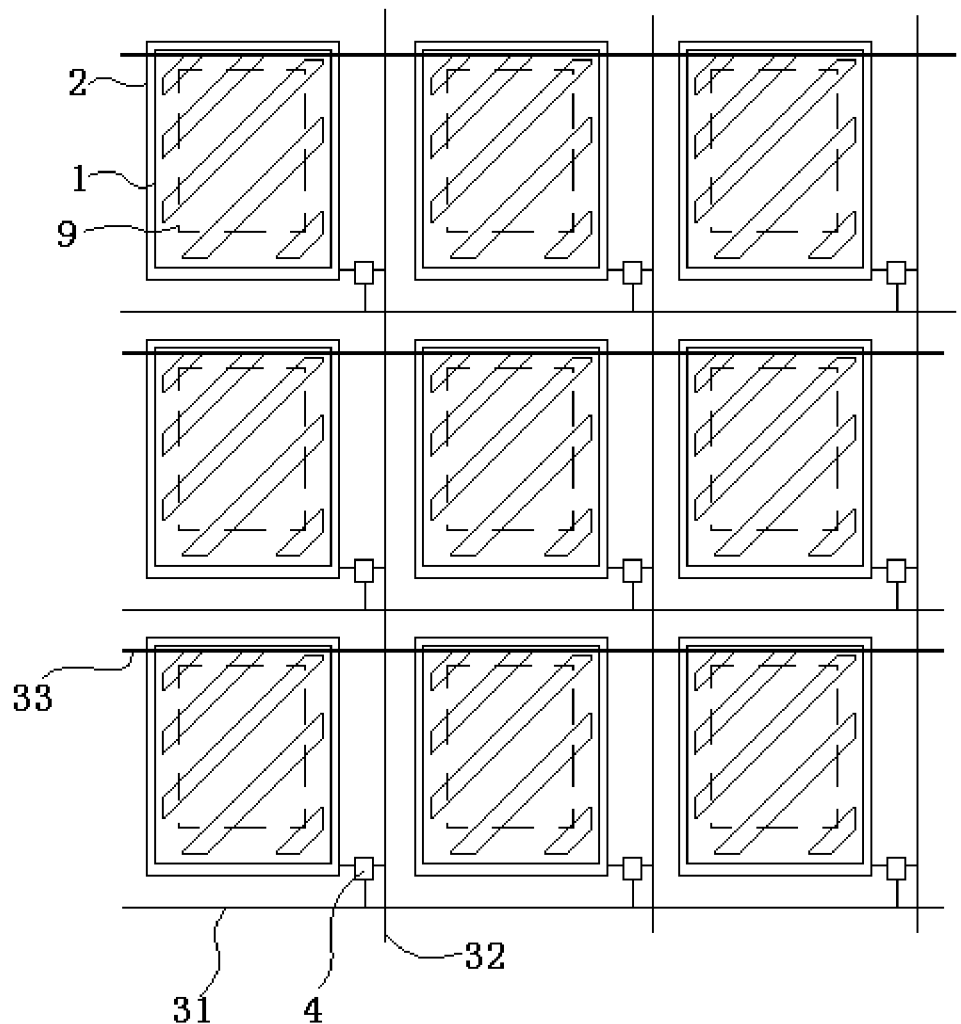
FIG. 2 is a schematic partial top view of the structure of the array substrate according to the Embodiment 1 of the present invention.

As shown in FIG. 2, the present embodiment provides an array substrate comprising intersecting gate lines 31 and data lines 32 which are intersected each other. A TFT 4 is provided at each of the intersections of the gate lines 31 and data lines 32, and a pixel unit 9 is defined for displaying necessary contents independently.

The array substrate is of FFS mode or ADS mode. Each pixel unit 9 is provided with a plate electrode 2 and a slit electrode 1 arranged above the plate electrode 2. An insulation layer (not shown) is arranged between the plate electrode 2 and the slit electrode 1.

As shown in FIG. 2, the plate electrode 2 in each pixel unit 9 extends to the peripheral region of the pixel unit 9, i.e., the plate electrode 2 exceeds the boundary of the pixel unit 9. The slit electrode 1 also extends to the peripheral region of the pixel unit 9, the plate electrode 2 and the slit electrode 1 are provided simultaneously in at least part of the peripheral region of the pixel unit 9.

In other words, the plate electrode 2 and the slit electrode 1 both have a part extending beyond the boundary of the pixel unit 9 and overlap at the peripheral region of the pixel unit 9, therefore they can generate a driving electric field at the peripheral region of the pixel unit 9. Thus the edge region of the pixel unit 9 no longer correspond to the edge of the slit electrode 1, the electric field generated at the edge region of the pixel unit is no longer different from that in the center of the pixel unit. Therefore the driving capability of the electric field to the liquid crystal at the edge region of the pixel unit 9 is enhanced, the efficiency of the liquid crystal is increased, the transmissivity of the pixel unit is increased, and therefore the transmissivity of the entire display device is increased.

Preferably, the plate electrode 2 and the slit electrode 1 are provided in the peripheral regions of the pixel unit at all directions, that is, all of the peripheral regions around the pixel unit.

As shown in FIG. 2, the plate electrode 2 and the slit electrode 1 are provided in the peripheral regions adjacent to any position of the edges of the pixel unit 9, in other words, the overlapped regions of the plate electrode 2 and the slit electrode 1 surround the pixel unit 9 completely. For example, when the pixel unit 9 is a rectangle, the outsides of the four sides and four corners are provided with overlapped plate electrode 2 and slit electrode 1. As discussed above, if the plate electrode 2 and the slit electrode 1 are provided at any peripheral position of the pixel unit 9, the transmissivity of the edge region of the pixel unit 9 adjacent to said position will be improved. Therefore it is preferable to provide overlapped plate electrode 2 and slit electrode 1 in all of the peripheral regions of the pixel unit 9, so that the transmissivity of all the edge regions of the pixel unit 9 can be improved to achieve an optimal effect of transmissivity improvement.

It should be understood that the transmissivity can also be improved if only part of the edge regions of the pixel unit 9 are provided with the plate electrode 2 and the slit electrode 1.

Preferably, as shown in FIG. 2, the regions of the slit electrode 1 (and the plate electrode 2) exceeding the pixel unit 9 do not overlap with the leads such as the gate lines 31 and the data lines 32, because if the slit electrode 1 and the like overlap with the leads, large parasitic capacitance will occur and affects the display quality.

Of course, it should be understood that the slit electrode 1 can be overlapped with the leads such as the gate lines 31 and the data lines 32, as long as an insulation layer is disposed therebetween.

In the present embodiment, the slit electrode 1 is a common electrode, and the plate electrode 2 is a pixel electrode. Therefore, as shown in FIG. 2, each slit electrode 1 is connected to the common electrode line 33 (which is in turn connected with a driving chip), and the common electrode line 33 is insulated from the plate electrode 2 (of course each slit electrode 1 can be connected with each other by connection lines); each plate electrode 2 is insulated from each other and each connected to a thin film transistor 4.

It should be understood that if the slit electrode 1 is the pixel electrode and the plate electrode 2 is the common electrode, it is also applicable.

Embodiment 2

Figure 3:
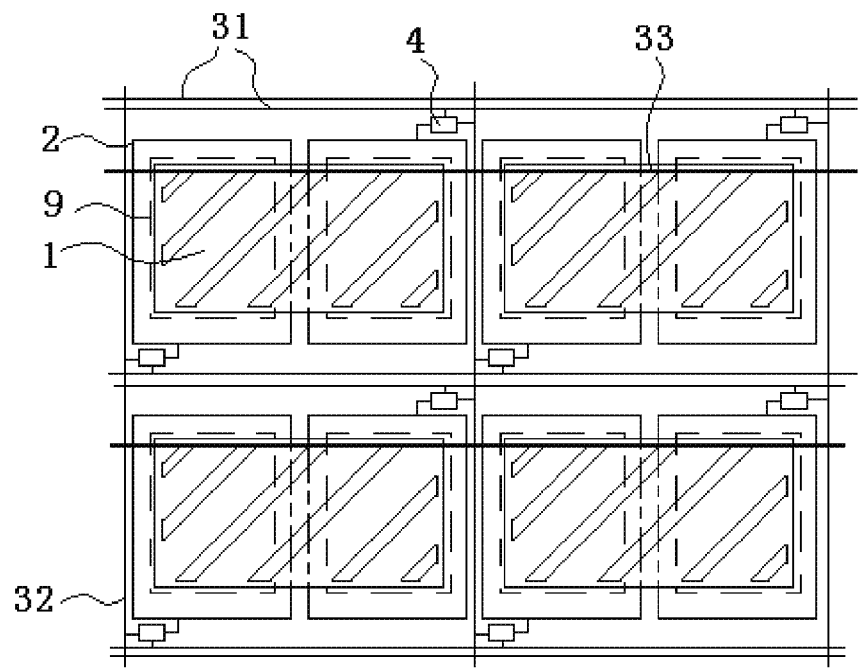
FIG. 3 is a schematic partial top view of the structure of the array substrate according to the Embodiment 2 of the present invention.

As shown in FIG. 3, the present embodiment provides an array substrate having a similar structure to that in the Embodiment 1.

The difference therebetween is that the array substrate according to the present embodiment utilizes a "dual gate lines" design, wherein the number of the gate lines 31 is doubled and that of the data lines 32 is halved, such design can reduce the number of the Data Driver ICs and the costs.

Specifically, as shown in FIG. 3, the disposing direction of the gate lines 31 is set as the row direction, and the disposing direction of the data lines 32 is set as the column direction. Two gate lines 31 are provided between two adjacent rows of pixel units 9, and every two pixel units 9 among the row of pixel units 9 are alternatively connected to two gate lines 31 at both sides of the row of pixel units 9. A data line 32 is provided at intervals of two columns of pixel units 9, each data line 32 is connected with two columns of pixel units 9 at both sides of the data line 32 simultaneously.

Preferably, the slit electrode 1 and the plate electrode 2 are provided in the peripheral region of the pixel unit 9 at one side which is not adjacent to the data lines 32 in the row direction.

That is, the slit electrode 1 and the plate electrode 2 are preferably provided in the peripheral region of the pixel units 9 at one side without the data lines 32 and the gate lines 31. The reason is as follows.

As mentioned above, the slit electrode 1 and the plate electrode 2 are preferably not overlapped with the leads such as the gate lines 31 and the data lines 32. With the increasing resolution increases, the gaps between the leads and the pixel units 9 are getting smaller and smaller. Thus the areas in the peripheral region of the pixel units 9 where the slit electrode 1 and the plate electrode 2 can be overlapped becomes smaller, if it is required that the slit electrode 1 and the plate electrode 2 are not overlapped with the leads. According to the solution of the present embodiment, since the dual gate line design is utilized, there is no leads (data lines 32) between parts of the pixel units 9, thus there is enough space between these pixel units 9 for disposing the slit electrode 1 and the plate electrode 2, such that the design and manufacture is more simple and have better effect on improving the transmissivity.

Further preferably, when the plate electrode 2 is a pixel electrode, and the slit electrode 1 is a common electrode, as shown in FIG. 3, the slit electrodes 1 of two adjacent pixel units 9 which are arranged in a same row and have no data line 32 therebetween are formed into an integral structure.

Usually, as shown in FIG. 1, when the slit electrode 1 is the common electrode, the slit electrodes 1 of pixel units 9 are electrically connected by the common electrode lines 33, but the slits thereof are not connected (i.e. they are located independently). In the present embodiment, as shown in FIG. 3, the slit electrodes 1 of two adjacent pixel units 9 without data line 32 therebetween are formed into an integral structure (i.e. the parts between two adjacent pixel units 9 are also the slit electrodes 1). In other words, each slit electrode 1 covers two adjacent pixel units 9 without data line 32 therebetween.

As discussed above, if the dual gate line design is used, there will be no leads between parts of the adjacent pixel units 9 in the row direction, therefore no parasitic capacitance will be introduced by disposing the slit electrodes 1 at these positions. Since now the slit electrode 1 is the common electrode, for better simplifying design and manufacturing process, the slit electrodes 1 of adjacent pixel units 9 without data line 32 therebetween can be formed into an integral structure, so as to form a "large slit electrode" covering two pixel units 9.

Above example is described taking the plate electrode 2 as the pixel electrode, and the slit electrode 1 as the common electrode. On the other hand, if plate electrode 2 is the common electrode, and the slit electrode 1 is the pixel electrode, the plate electrodes 2 of two adjacent pixel units 9 which are arranged in a same row and have no data line 32 therebetween can be formed into an integral structure, and the detail is not repeated hereby.

It should be understood that, although the present embodiment is exemplified using the "dual gate lines" design, a "N gate lines" design is also possible. That is, the number of the gate lines 31 can be increased N times (N being an integer larger than 2, such as 3, 4, 5 and etc.), and the number of the data line 32 can be reduced by 1/N. In this way, there can be more adjacent pixel units 9 without data lines 32 therebetween in the row direction, thus more space in the periphery of the pixel units can be left for disposing the slit electrodes 1 and the plate electrode 2, and the slit electrodes (or plate electrodes 2) of more pixel units 9 can be integrated together. Of course, when N is 3 or larger than 3, parts of the leads will be overlapped, at this time, additional insulation layer is required and will not be described in detail.

Embodiment 3

Figure 4:
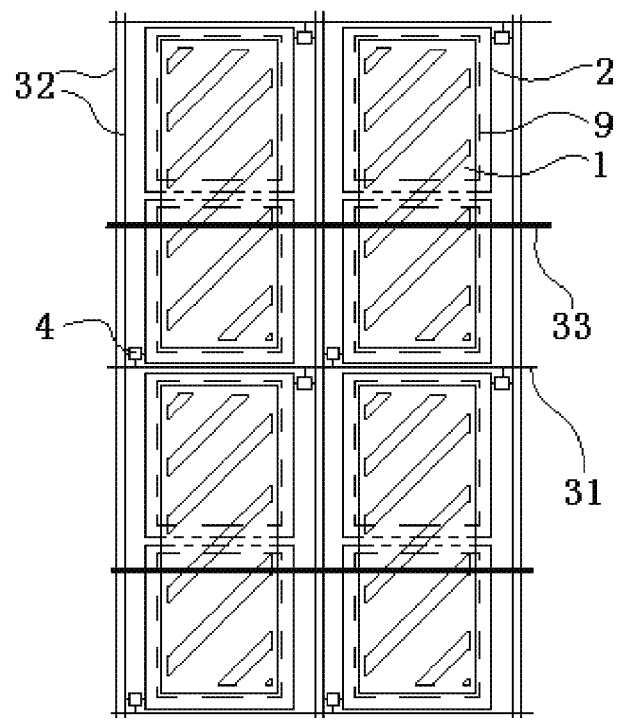
FIG. 4 is a schematic partial top view of the structure of the array substrate according to the Embodiment 3 of the present invention.

As shown in FIG. 4, the present embodiment provides an array substrate having a similar structure to that in the Embodiment 2.

The difference therebetween is that the present embodiment uses a "dual data lines" design instead of the "dual gate lines" design.

As shown in FIG. 4, in the array substrate of the present embodiment, the number of the data lines 32 is doubled and that of the gate lines 31 is halved. Specifically, the disposing direction of the gate lines 31 is set as the row direction, and the disposing direction of the data lines 32 is set as the column direction. A gate line 31 is provided at intervals of 2 rows of pixel units 9, each gate line 31 is connected with 2 rows of pixel units 9 at both sides of the gate line 31 simultaneously. Two data lines 32 are provided between two adjacent columns of pixel units 9, and every two pixel units 9 among each column of pixel units 9 are alternatively connected to two data lines 32 at both sides of the column of pixel units 9.

Preferably, the slit electrode 1 and the plate electrode 2 are provided in the peripheral region of the pixel units 9 at one side which is not adjacent to the gate lines 31 in the column direction.

Apparently, if the "dual data lines" design is utilized, there is no gate line 31 between parts of the pixel units 9 in the column direction, thus there is enough space left for disposing the slit electrode 1 and the plate electrode 2, such that the design and manufacture difficulty can be reduced.

Further preferably, when the plate electrode 2 is the pixel electrode, and the slit electrode 1 is the common electrode, the slit electrodes 1 of two adjacent pixel units 9 which are arranged in a same column and have no gate line 31 therebetween are formed into an integral structure.

Similar to Embodiment 2, the slit electrodes 1 of adjacent pixel units 9 without gate line 31 therebetween can be formed into an integral structure so as to reduce the design and manufacture difficulty.

Of course, when the plate electrode 2 is the common electrode and the slit electrode 1 is the pixel electrode, the plate electrode 2 of two adjacent pixel units 9 which are arranged in a same column and have no gate line 31 therebetween can also be formed into an integral structure.

Besides, the present embodiment can use the "N data lines" design, that is, the number of the data lines 32 can be increased N times (N being an integer larger than 2, such as 3, 4, 5 and etc.), and the number of the gate lines 31 can be reduced by 1/N. In this way, there can be more adjacent pixel units 9 without gate lines 31 therebetween in the column direction, thus more space in the periphery of the pixel units can be left for disposing the slit electrodes 1 and the plate electrodes 2.

Embodiment 4

The present embodiment provides a liquid crystal display device comprising the above array substrate.

Of course, the liquid crystal display device of the present embodiment also include other known structures such as the power supply unit, the driving chip, the color filter substrate, the backlight source and the like.

The liquid crystal display device of the present embodiment may be any products or parts with display function such as liquid crystal display panels, electronic papers, mobile phones, tablet computers, televisions, monitors, notebook computers, digital picture frames and navigation systems.

The liquid crystal display device of the embodiment has high transmissivity by comprising the above array substrate.

It should be understood that the above descriptions are only illustrative embodiments for explain the principle of the present invention. The present invention is not limited thereto. Any variation or improvement is readily conceivable to those skilled in the art without departing from the concept and substance of the present invention, and those variation and improvement are intended to be encompassed by the protection scope of the present invention.

The invention claimed is:

1. An array substrate comprising a plurality of pixel units, each pixel unit is a display region for light outputting and is provided with a plate electrode and a slit electrode arranged above the plate electrode, an insulation layer is provided between the plate electrode and the slit electrode, and the plate electrode extends to the periphery region of the pixel unit, wherein the slit electrode extends to the periphery regions of the pixel unit; and the slit electrode and the plate electrode are both provided in at least part of the periphery region of the pixel unit, said periphery region of the pixel unit being the interval regions between the pixel units;

wherein the array substrate further comprises a plurality of gate lines and a plurality of data lines intersecting with each other;

wherein the direction along which the gate lines are arranged is set as the row direction and the direction along which the data lines are arranged is set as the column direction;

N gate lines are provided between each two adjacent rows of pixel units, each pixel unit in each row of the pixel units are connected with N gate lines at both sides of the row of pixel units in an alternative manner, N being an integer no less than 2;

one data line is provided at intervals of N columns of pixel units, each data line is connected with N columns of pixel units simultaneously; and wherein the slit electrodes of N adjacent pixel units which are arranged in a same row and have no data line therebetween are formed into an integral structure.

2. The array substrate according to claim 1, wherein the plate electrode is a pixel electrode, and the slit electrode is a common electrode.

3. The array substrate according to claim 1, wherein the plate electrode is a common electrode, and the slit electrode is a pixel electrode; and the plate electrodes of N adjacent pixel units which are arranged in a same row and have no data line therebetween are formed into an integral structure.

4. The array substrate according to claim 1, wherein said N is two.

5. An array substrate comprising a plurality of pixel units, each pixel unit is a display region for light outputting and is provided with a elate electrode and a slit electrode arranged above the plate electrode, an insulation layer is provided between the plate electrode and the slit electrode, and the plate electrode extends to the periphery region of the pixel unit,
wherein
the slit electrode extends to the periphery regions of the pixel unit; and
the slit electrode and the plate electrode are both provided in at least part of the periphery region of the pixel unit, said periphery region of the pixel unit being the interval regions between the pixel units;
wherein the array substrate further comprises a plurality of gate lines and a plurality of data lines intersecting with each other, wherein
the direction along which the gate lines are arranged is set as the row direction, and the direction along which the data lines are arranged is set as the column direction;
one gate line is provided at intervals of N rows of pixel units, each gate line is connected with N rows of pixel units simultaneously, N being an integer no less than 2;
N data lines are provided between each two adjacent columns of pixel units, each pixel unit in each column of the pixel units are connected with N data lines at both sides of the column of pixels units in an alternative manner; and
wherein the slit electrodes of N adjacent pixel units which are arranged in a same column and have no gate line therebetween are formed into an integral structure.

6. The array substrate according to claim 5, wherein the plate electrode is a pixel electrode, and the slit electrode is a common electrode.

7. The array substrate according to claim 5, wherein the plate electrode is a common electrode, and the slit electrode is a pixel electrode; and
the plate electrodes of N adjacent pixel units which are arranged in a same column and have no gate line therebetween are formed into an integral structure.

8. The array substrate according to claim 5, wherein said N is two.

9. The array substrate according to claim 1, wherein the plate electrode and the slit electrode are provided in the periphery regions of the pixel unit in all directions.

10. A liquid crystal display device comprising the array substrate according to claim 1.

* * * * *